United States Patent
Miyazawa

(10) Patent No.: US 7,015,109 B2
(45) Date of Patent: Mar. 21, 2006

(54) INTERDIGITAL CAPACITOR AND METHOD FOR ADJUSTING THE SAME

(75) Inventor: Naoyuki Miyazawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/986,653

(22) Filed: Nov. 12, 2004

(65) Prior Publication Data

US 2005/0064657 A1    Mar. 24, 2005

Related U.S. Application Data

(62) Division of application No. 10/396,502, filed on Mar. 26, 2003, now Pat. No. 6,903,402.

(30) Foreign Application Priority Data

Mar. 28, 2002    (JP) .............................. 2002-093377

(51) Int. Cl.
*H01L 21/20* (2006.01)
(52) U.S. Cl. ...................... 438/381; 438/393
(58) Field of Classification Search .............. 438/381, 438/393, 190, 210, 239, 329
See application file for complete search history.

(56) References Cited

U.S. PATENT DOCUMENTS

| | | | | |
|---|---|---|---|---|
| 5,446,016 A | * | 8/1995 | Tanaka et al. ............... | 505/329 |
| 5,565,778 A | * | 10/1996 | Brey et al. .................. | 324/318 |
| 5,619,140 A | * | 4/1997 | Brey et al. .................. | 324/318 |
| 6,373,083 B1 | | 4/2002 | Oh | |
| 2004/0209435 A1 | * | 10/2004 | Partridge et al. ........... | 438/381 |
| 2004/0246077 A1 | * | 12/2004 | Misu et al. ................. | 333/195 |
| 2005/0063135 A1 | * | 3/2005 | Borland et al. ............. | 361/303 |
| 2005/0184357 A1 | * | 8/2005 | Chiba ......................... | 257/531 |

FOREIGN PATENT DOCUMENTS

| JP | 6-232672 | 8/1994 |
|---|---|---|
| JP | 8-130433 | 5/1996 |

* cited by examiner

*Primary Examiner*—S. V. Clark
(74) *Attorney, Agent, or Firm*—Westerman, Hattori, Daniels & Adrian, LLP

(57) ABSTRACT

An interdigital capacitor includes a semiconductor substrate, and a pair of comb-like electrodes formed on the semiconductor substrate. At least one of the pair of comb-like electrodes includes a cutting target portion.

8 Claims, 11 Drawing Sheets

US 7,015,109 B2

INTERDIGITAL CAPACITOR AND METHOD FOR ADJUSTING THE SAME

CROSS REFERENCE OF RELATED APPLICATIONS

This application is a Divisional of application Ser. No. 10/396,502, which was filed on Mar. 26, 2003 now U.S. Pat No. 6,903,402.

BACKGROUND OF THE INVENTION

1. Field of the Invention

The present invention generally relates to a device having a capacitor, such as an oscillator, and more particularly, to an interdigital capacitor used in a high-frequency circuit and a method for adjusting the same.

2. Description of the Related Art

An MIM (Metal Insulator Metal) capacitor and an interdigital capacitor are known as capacitors used in high-frequency circuits that handle a frequency as high as 1 GHz or over. Usually, these capacitors are incorporated in an MMIC (Monolithic Microwave Integrated Circuit). For example, the MIM is made up of a pair of electrodes formed on a semi-insulating GaAs substrate, and a dielectric member sandwiched between the pair of electrodes. The interdigital capacitor has an interdigital electrode pattern formed on a semi-insulating GaAs substrate.

Generally, the capacitor is required to have a smaller capacitance, as the frequency is higher. For example, the capacitance required in the 40 GHz band is as small as 30 fF. The capacitor having such a small capacitance should be compact. For instance, a capacitance of 30 fF by an MIM capacitor having a per-unit-area capacitance of 0.4 fF/$\mu$m$^2$ needs a square electrode having a side of 8.7 $\mu$m. The capacitance will deviate from 30 fF unless the above dimensions are accurately realized. Such a deviation of the capacitance will affect the circuit operation. For example, the oscillator employing the MIM capacitor will have a frequency error that depends on a capacitance deviation. It is to be noted that current technology has a difficulty in accurate production of an electrode pattern of MIM capacitor having a side equal to or smaller than 10 $\mu$m. In other words, the MIM capacitors currently available have a large variation in capacitance.

In contrast, the interdigital capacitor is suitable for use in a millimeter wave band higher than 30 GHz, and is capable of accurately realizing a capacitance as small as tens of fF. The interdigital capacitor has a pair of comb-like electrodes, which are formed on a semiconductor substrate of silicon or semi-insulating GaAs. Electrode fingers of the comb-like electrodes are alternately arranged.

A method for adjusting the capacitance of the interdigital capacitor is described in Japanese Unexamined Patent Publication No. 6-232672. This method is now described with reference to FIG. 1. Referring to this figure, two comb-like electrodes 10 and 12 are formed on a substrate made of silicon or semi-insulating GaAs. Pairs 14 and 16 of electrode fingers for use in capacitance adjustment are provided in a path along which a surface acoustic wave travels. The capacitance can be adjusted by connecting the pair 14 of electrode fingers to the comb-like electrodes 10 and 12 by bonding wires 18 and 20.

Another frequency adjustment method is described in Japanese Unexamined Patent Publication No. 8-130433. This method employs trimming of the comb-like electrodes. The method is now described with reference to FIG. 2.

Referring to this figure, two comb-like electrodes 22 and 24 are formed on the substrate. An oxide film is formed on the comb-like electrode 24 by a process of, for example, anode oxidization. The capacitance can be adjusted by trimming the comb-electrode 22 on which no oxide film is deposited. During trimming, metal of the comb-like electrode 22 is scattered and adheres to the comb-like electrode 24. However, the oxide film formed on the metal of the comb-like electrode 24 prevents scattered metal from adhering thereto. Thus, it is possible to avoid a possibility that electrode fingers or the comb-like electrodes may be short-circuited.

However, the above-mentioned two conventional techniques cannot be used in the millimeter wave band over 30 GHz.

FIG. 3 shows an interdigital capacitor usable in the millimeter wave band. In order to realize a capacitance of 0.05 pF, the comb-like electrode length L1 is approximately 60 $\mu$m, the electrode finger length L2 is approximately 50 $\mu$m, the electrode finger width W is approximately 2 $\mu$m, the finger-to-finger gap G is 2 $\mu$m, and the number N of electrode fingers is 16. It is required to adjust as a small capacitance as 0.05 pF by a step of, for example, 0.005 pF.

The adjustment method proposed in Japanese Unexamined Patent Publication No. 6-232672 is suitable for a large capacitor having a capacitance as large as 1 pF used in a relatively low frequency equal to or lower than 5 GHz. However, it is impossible to accurately adjust the capacitance as small as 0.05 pF used in the millimeter wave band equal to or higher than 30 GHz (for example, by the 0.005 pF step). This is because the bonding pads for bonding the wires 18 and 20 needs 50 $\mu$m$^2$ at minimum, to which a parasitic capacitance of about 0.2 pF is connected.

The adjustment method proposed in Japanese Unexamined Patent Publication No. 8-130433 has a problem arising from forming the oxide film. If an element exists in the vicinity of the interdigital capacitor, the element may be damaged at the time of forming the oxide film by anode oxidization. Thus, the method cannot be suitably applied to MMIC in which the interdigital capacitor is required to be arranged close to an FET (Field Effect Transistor) or the like. In practice, the adjustable interdigital capacitor can be applied to a limited application in which the interdigital capacitor is used alone. Besides the above, there is another disadvantage in which a parasitic capacitor is connected to a pad necessary for anode oxidization.

SUMMARY OF THE INVENTION

A general object of the present invention is to provide an interdigital capacitor and a method for adjusting the same in which the above disadvantages are eliminated.

A more specific object of the present invention is to provide an interdigital capacitor and a method for adjusting the same in which the capacitance can be adjusted in a high-frequency band equal to or higher than tens of GHz.

According to an aspect of the present invention, there is provided an interdigital capacitor comprising: a semiconductor substrate; and a pair of comb-like electrodes formed on the semiconductor substrate, at least one of the pair of comb-like electrodes including a cutting target portion.

According to another aspect of the present invention, there is provided an interdigital capacitor comprising: a semiconductor substrate; and a pair of comb-like electrodes formed on the semiconductor substrate, each of the pair of comb-like electrodes having first and second electrode portions, the first and second electrode portions including electrode fingers that have at least one of different widths, lengths and gaps.

According to another aspect of the present invention, there is provided an interdigital capacitor comprising: a first pair of comb-like electrodes connected to signal lines; and a second pair of comb-like electrodes that are cut off from the first pair of comb-like electrodes and have no electrical connections to the signal lines.

According to another aspect of the present invention, there is provided a semiconductor device comprising: an interdigital capacitor formed on a semiconductor substrate; and a circuit element formed on the semiconductor substrate, the interdigital capacitor comprising a pair of comb-like electrodes formed on the semiconductor substrate, at least one of the pair of comb-like electrodes including a cutting target portion.

According to another aspect of the present invention, a semiconductor device comprising: an interdigital capacitor formed on a semiconductor substrate; and a circuit element formed on the semiconductor substrate, the interdigital capacitor comprising a pair of comb-like electrodes formed on the semiconductor substrate, each of the pair of comb-like electrodes having first and second electrode portions, the first and second electrode portions including electrode fingers that have at least one of different widths, lengths and gaps.

According to another aspect of the present invention, there is provided a semiconductor device comprising: an interdigital capacitor formed on a semiconductor substrate; and a circuit element formed on the semiconductor substrate, the interdigital capacitor comprising a first pair of comb-like electrodes connected to signal lines; and a second pair of comb-like electrodes that are cut off from the first pair of comb-like electrodes and have no electrical connections to the signal lines.

According to another aspect of the present invention, there is provided a communication device comprising: a first circuit having an interdigital capacitor; and a second circuit processing a transmit or receive signal by using an output signal of the first circuit, the interdigital capacitor comprising: a semiconductor substrate; and a pair of comb-like electrodes formed on the semiconductor substrate, at least one of the pair of comb-like electrodes including a cutting target portion.

According to another aspect of the present invention, there is provided a method for adjusting an interdigital capacitor comprising a pair of comb-like electrodes formed on a semiconductor substrate, and an insulating film that covers the pair of comb-like electrodes and a surface of the semiconductor substrate, the method comprising the steps of: (a) projecting a laser beam onto the insulating film so as to form windows in the insulating film; and (b) cutting bus lines of the pair of comb-like electrodes exposed via the windows so that each of the pair of comb-like electrodes is divided into two parts.

According to another aspect of the present invention, there is provided a method for adjusting an interdigital capacitor comprising a pair of comb-like electrodes formed on a semiconductor substrate, and an insulating film that covers the pair of comb-like electrodes and a surface of the semiconductor substrate, the method comprising the steps of: (a) projecting a first laser beam having a first wavelength onto the insulating film so as to form windows in the insulating film; and (b) projecting a second laser beam having a second wavelength onto portions of the comb-like electrodes exposed via the windows so as to divide each of the pair of comb-like electrodes into two parts.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

Figure 4A:
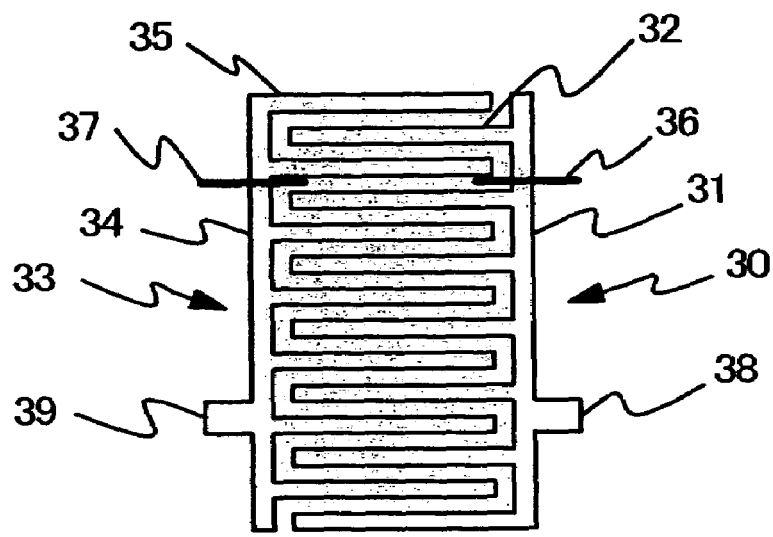
FIG. 4A is a plan view of an interdigital capacitor according to a first embodiment of the present invention before the capacitance thereof is adjusted.
Figure 4B:
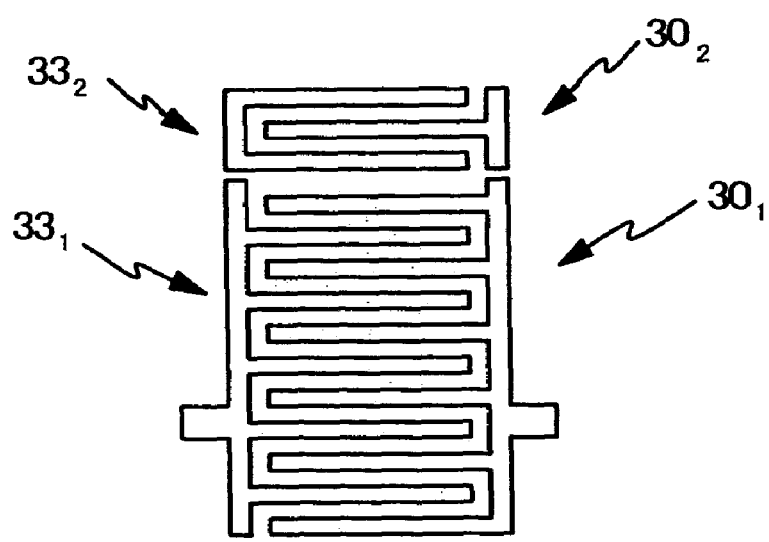
FIG. 4B is a plan view of the interdigital capacitor according to the first embodiment of the present invention after the capacitance thereof is adjusted.

FIGS. 4A and 4B illustrate an interdigital capacitor according to a first embodiment of the present invention. More particularly, FIG. 4A is a plan view of the interdigital capacitor before the capacitance thereof is adjusted, and FIG. 4B is a plan view of the interdigital capacitor after the capacitance is adjusted.

The interdigital capacitor has comb-like electrodes 30 and 33 that are paired. The comb-like electrode 30 has a bus line (bus bar) 31, and electrode fingers 32 that are arranged at equal intervals and run from the bus line 31 in the same direction. The bus line 31 connects the electrode fingers 32. Similarly, the comb-like electrode 33 has a bus line 34, and electrode fingers 35 that are arranged at equal intervals and run from the bus line 34 in the same direction. The bus line 34 connects the electrode fingers 35. Signal lines 38 and 39 are connected to the bus lines 31 and 34, respectively. The comb-like electrodes 30 and 33 are formed on a semiconductor substrate made of, for example, silicon or semi-insulating GaAs. The drawing sheet corresponds to an electrode-formed surface of the semiconductor substrate. The interdigital capacitor is a semiconductor device.

The capacitance is adjustable by cutting off the bus lines 31 and 34 of the comb-like electrodes 30 and 33 along cutting positions 36 and 37. The bus lines 31 and 34 can be cut off by projecting a laser beam thereon in the cutting positions 36 and 37. By the above laser trimming process, as shown in FIG. 4B, the comb-like electrode 30 is divided into two parts $30_1$ and $30_2$, and the comb-like electrode 33 is divided into two parts $33_1$ and $33_2$. By the trimming, some electrode fingers are removed from the comb-like electrodes 30 and 33, which have a reduced number N of electrode fingers. Therefore, the interdigital capacitor has a reduced capacitance. In practice, when the semiconductor device equipped with the interdigital capacitor shown in FIG. 4A is tested, trimming is performed as necessary. In test, the characteristics of the interdigital capacitor (for example, the capacitance value) and a circuit including the interdigital capacitor are monitored. The interdigital capacitor may be adjusted by repeatedly trimming the comb-like electrodes 30 and 33 until the desired characteristics can be obtained. When the interdigital capacitor is a component of an oscillator, the oscillation frequency may be monitored for capacitance adjustment. For example, when the interdigital capacitor is used in an amplifier circuit, the output voltage thereof may be monitored.

Figure 1:
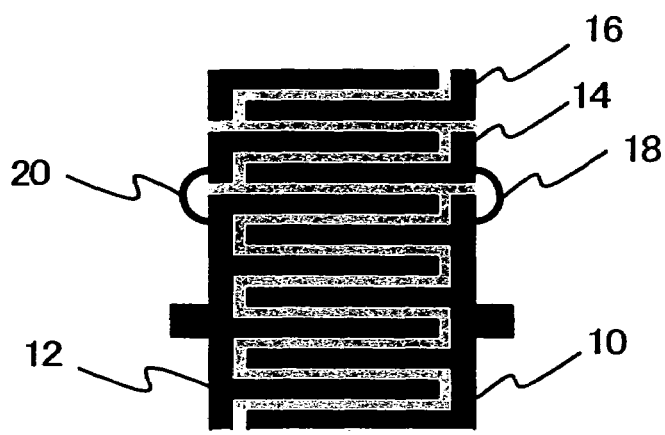
FIG. 1 illustrates a conventional method for adjusting the capacitance of an interdigital capacitor.
Figure 2:
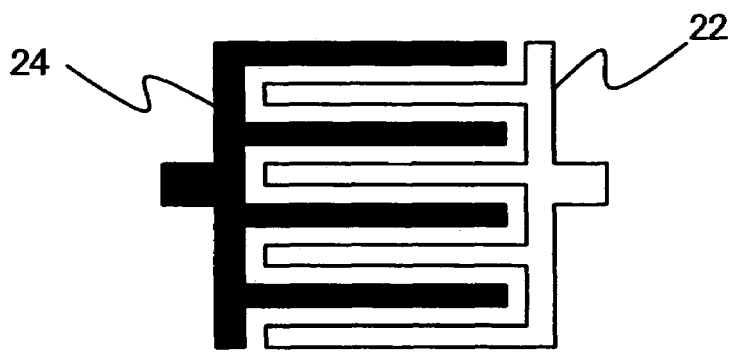
FIG. 2 illustrates another conventional method for adjusting the capacitance of an interdigital capacitor.
Figure 3:
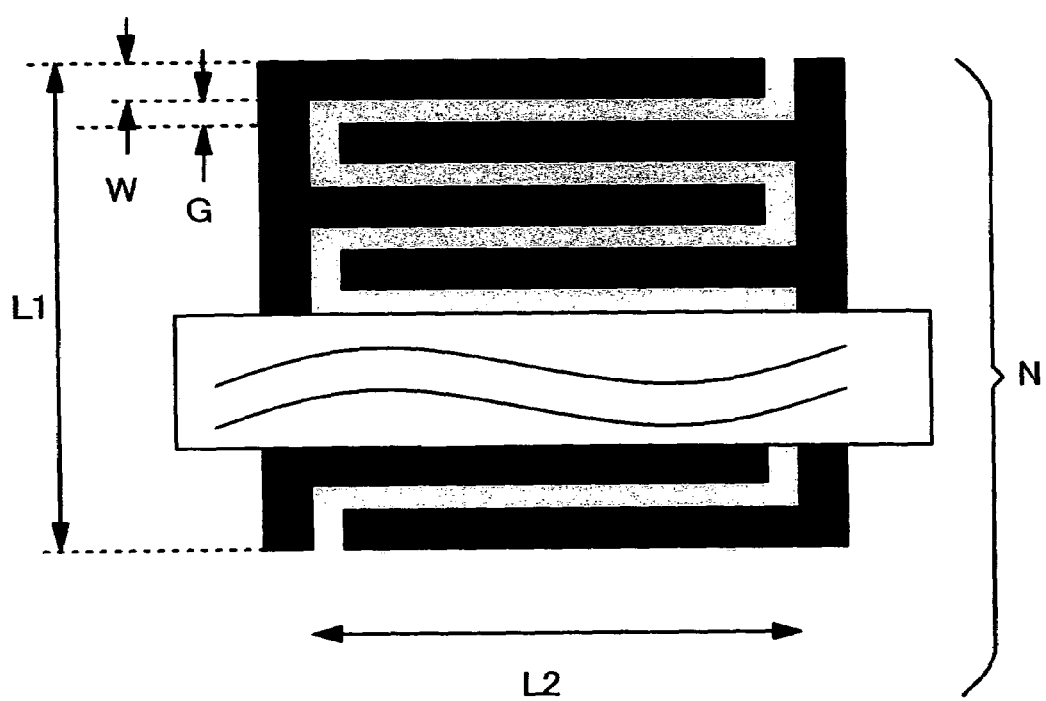
FIG. 3 illustrates an interdigital capacitor capable of realizing a fine capacitance necessary for a millimeter wave band.

When it is assumed that the interdigital capacitor shown in FIG. 4A has the parameter values that have been described with reference to FIG. 3, the capacitance can be reduced to 0.04 pF from 0.05 pF by removing three electrode fingers as shown in FIG. 4B.

According to the first embodiment of the present invention, it is possible to accurately adjust the capacitance of the interdigital capacitor required in the millimeter wave band, for example, on the 0.005 pF basis. The capacitance adjustment does not use any wire bonding, and does not have any problem of parasitic capacitance. Further, the capacitance adjustment does not need any oxide film for covering the metal of the electrodes, so that circuit elements in the vicinity of the interdigital capacitor cannot be affected at the time of forming the oxide film.

In the above description, both the comb-like electrodes 30 and 33 are trimmed. Alternatively, only one of the comb-like electrodes 30 and 33 may be trimmed. The cutting positions 36 and 37 are transversally aligned in FIG. 4A. Alternatively, the comb-like electrodes 36 and 37 may be cut in different positions. For example, the cutting position 36 is slightly moved downwardly in FIG. 4A, so that two electrode fingers can be removed from the comb-like electrode 30. The cutting-based adjustment cannot increase the capacitance but merely decreases it. Therefore, it is preferable to prepare the interdigital capacitor so as to have a capacitance larger than the target capacitance.

The cut-off electrode fingers are not electrically connected to the signal lines 38 and 39 and are not embedded into a circuit associated with the interdigital capacitor. That is, the interdigital capacitor having an adjusted capacitance includes the comb-like electrodes $30_1$ and $33_1$ respectively connected to the signal lines 38 and 39, and the comb-like electrodes $30_2$ and $33_2$ electrically isolated from the comb-like electrodes $30_1$ and $33_1$ and the signal lines 38 and 39. The cut-off comb-like electrodes $30_2$ and $33_2$, which are no longer involved in making capacitance, are positioned in the direction in which the electrode fingers of the comb-electrodes $30_1$ and $33_1$ are alternately arranged side by side.

(Second Embodiment)

Figure 5:
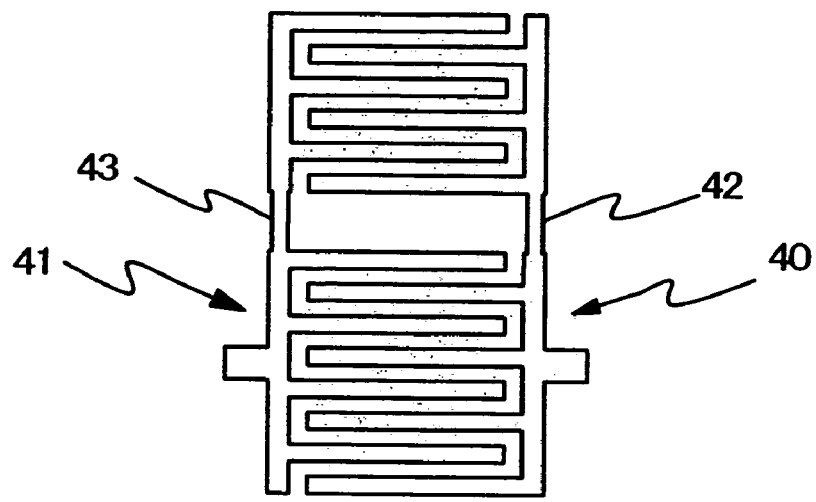
FIG. 5 is a plan view of an interdigital capacitor according to a second embodiment of the present invention.

FIG. 5 is a plan view of an interdigital capacitor according to a second embodiment of the present invention. This interdigital capacitor has comb-like electrodes 40 and 41 that are paired and formed on a semiconductor substrate made of, for example, silicon or semi-insulating GaAs. The bus lines of the comb-like electrodes 40 and 41 have comparatively narrow portions 42 and 43. The narrow portions 42 and 43 are narrower than the remaining portions of the comb-like electrodes 40 and 41, and are subject to cutting for capacitance adjustment. The narrow portions 42 and 43 of the bus lines can be cut by relatively weak laser energy. The narrow portions 42 and 43 may be defined as cutting targets. The narrowed cutting targets contribute to reducing the amount of metal scattered at the time of cutting. In FIG. 5, the cutting targets 42 and 43 face each other. However, the cutting targets 42 and 43 may be arranged in another way. Only one of the cutting targets 42 and 43 may be provided in the corresponding one of the comb-like electrodes 40 and 41. It is also possible to provide a plurality of cutting target portions in each of the comb-like electrodes 40 and 41 and to thus adjust the capacitance within an increased range.

(Third Embodiment)

Figure 6:
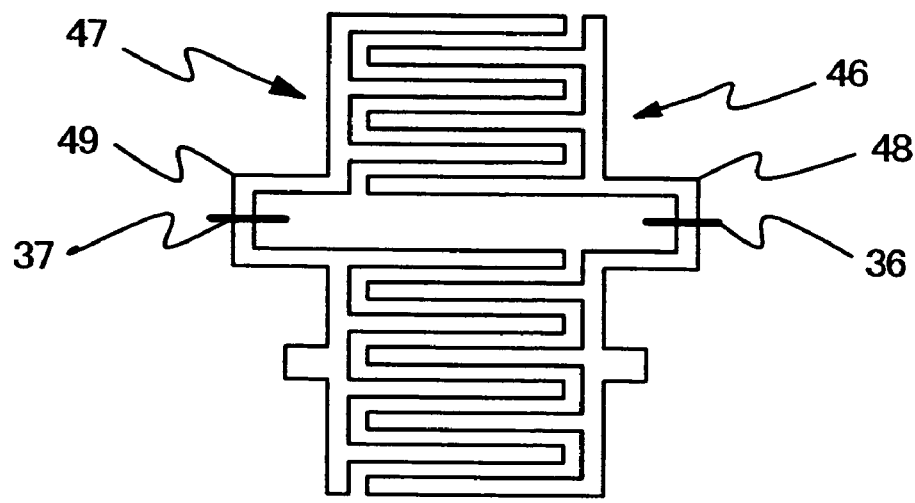
FIG. 6 is a plan view of an interdigital capacitor according to a third embodiment of the present invention.

FIG. 6 is a plan view of an interdigital capacitor according to a third embodiment of the present invention. Comb-like electrodes 46 and 47 formed on a semiconductor substrate have approximately C-shaped bus line portions 48 and 49, respectively. The portion 48 serves as a cutting target and is curved outward from the bus line. Similarly, the portion 49 serves as a cutting part and is curved outward from the bus line. No electrode fingers are formed to the bus line portions 48 and 49, which are dedicated to trimming. Each of the comb-like electrodes 46 and 47 may be divided into two parts by cutting the bus line portions 48 and 49 by laser. The cutting target portions 36 and 37 are away from the electrode fingers involved in making capacitance, so that the electrode fingers can be less affected due to cutting.

The approximately C-shaped bus line portions 48 and 49 may be narrowed like the second embodiment of the present invention. The third embodiment of the present invention may be combined with the second embodiment thereof so that the bus lines 46 and 47 have comparatively narrow portions in addition to the approximately C-shaped portions.

(Fourth Embodiment)

Figure 7A:
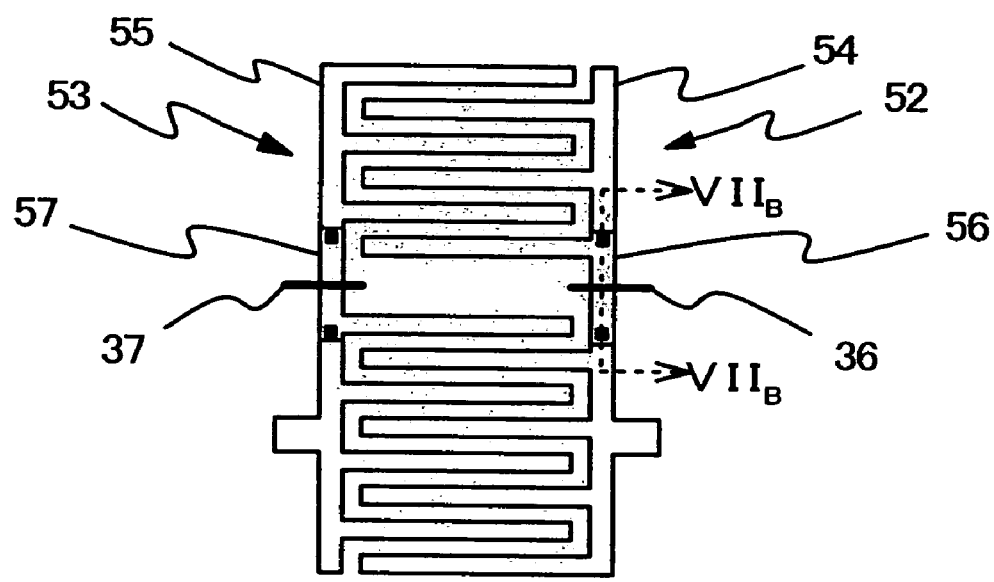
FIG. 7A is a plan view of an interdigital capacitor according to a fourth embodiment of the present invention.
Figure 7B:
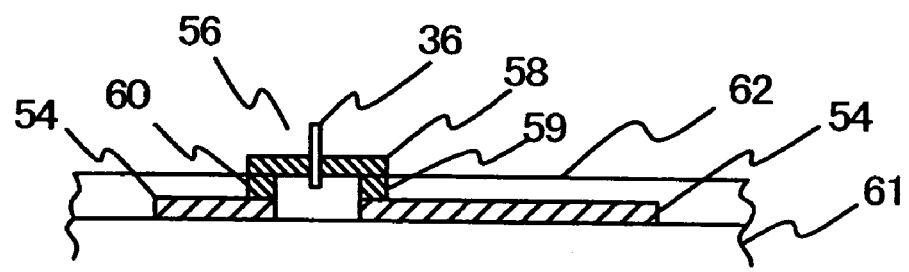
FIG. 7B is a cross-sectional view taken along line $VII_B$—$VII_B$ shown in FIG. 7A.

FIG. 7A is a plan view of an interdigital capacitor according to a fourth embodiment of the present invention, and FIG. 7B is a cross-sectional view taken along a line $VII_B$—$VII_B$ shown in FIG. 7A. A bus lie 54 of a comb-like electrode 52 formed on a semiconductor substrate has a cutting target portion 56. Similarly, a bus line 55 of a comb-electrode 53 formed on the semiconductor substrate has a cutting target portion 57. The cutting target portions 56 and 57 may have an identical structure. FIG. 7B illustrates a cross section of the cutting target portion 56. The bus line 54 formed on the semiconductor substrate, now assigned a reference numeral 61, is divided into two portions. An area defined by the opposing ends of the divided portions is full of an insulating film 62, which also covers the entire surface of the semiconductor substrate 61. Vias 59 and 60 are provided in the insulating film 62. These vias 59 and 60 have via holes formed in the insulating film 62, which are filled with the same material as that of the comb-like electrodes 52 and 53. An upper interconnection line 58 that connects the vias 59 and 60 is formed on the insulating film 62. The upper interconnection line 58 is away from the semiconductor substrate 61. The upper interconnection line 58 may have the same width as that of the bus line 54 or may be narrower than the bus line 54. The upper interconnection line 58 may have the same or different thickness as that of the bus line 54. When the upper interconnection line 58 is narrower and/or thinner than the bus line 54, it may be cut more easily. The upper interconnection line 58 electrically connects the two divided portions of the bus line 54. The bus line 54 has a multilayer wiring structure as described above. The capacitance of the interdigital capacitor can be adjusted by cutting the upper interconnection line 58. The cutting target portion 57 has an upper interconnection line that is the same as the upper interconnection line 58 of the cutting target potion 56.

The bus line portions that are subject to cutting are implemented by a layer higher than the layer of the finger electrodes. This makes it possible to prevent the characteristics and performance from being degraded due to scattering of fine metal pieces and deposition thereof at the time of cutting. These effects become more conspicuous by using the narrower and/or thinner upper interconnection line 58, which also facilitate cutting.

Although the cutting target portions 56 and 57 face each other in FIG. 7A, these portions may be arranged so as not to face each other. The fourth embodiment of the present invention may be combined with the second and/or third embodiment thereof.

(Fifth Embodiment)

Figure 8A:
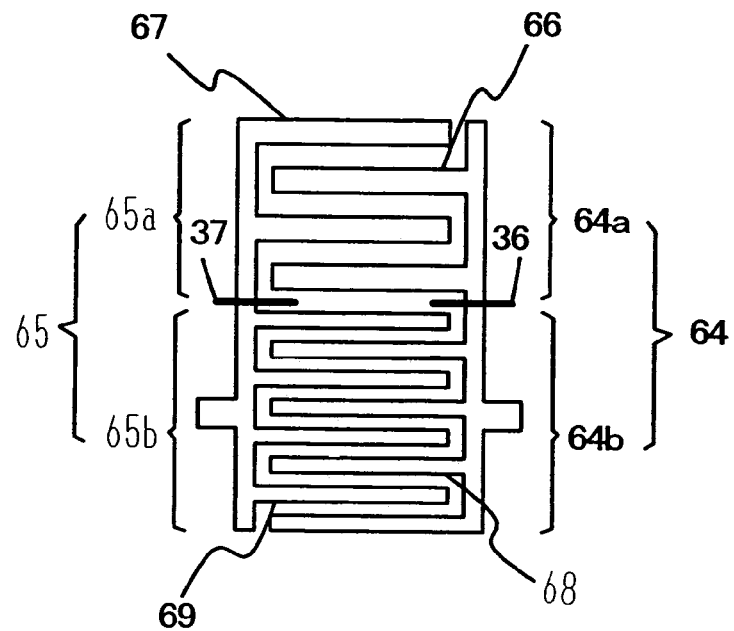
FIGS. 8A and 8B are plan views of interdigital capacitors according to a fifth embodiment of the present invention.
Figure 8B:
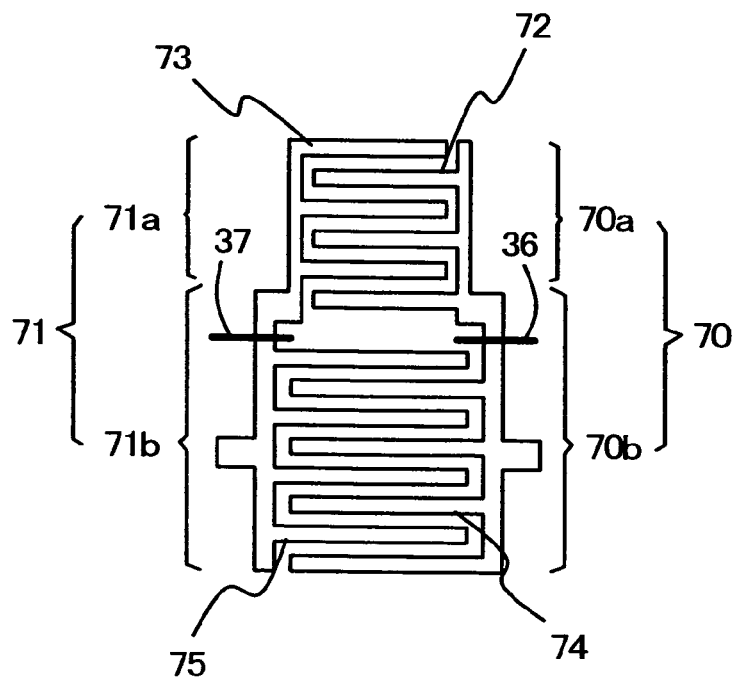

FIG. 8A is a plan view of an interdigital capacitor according to a fifth embodiment of the present invention, and FIG. 8B is a plan view of another interdigital capacitor according to the fifth embodiment. The fifth embodiment of the present invention has a structure such that each of a pair of comb-like electrodes formed on a semiconductor substrate has first and second electrode portions that have different length and/or width of electrode fingers.

Referring to FIG. 8A, the interdigital capacitor has comb-like electrodes 64 and 65 formed on the semiconductor substrate. The comb-like electrode 64 has a first electrode portion 64a and a second electrode portion 64b continuing to each other, these portions having different electrode finger widths W and finger-to-finger gaps G. The first electrode portion 64a has electrode fingers 66, and the second electrode portions 64b has electrode fingers 68. The electrode fingers 66 are wider than the electrode fingers 68. The first electrode portion 64a has a comparatively wide electrode finger width and a comparatively wide gap, while the second electrode portion 64b has a comparatively narrow electrode finger width and a comparatively narrow gap. Similarly, the comb-like electrode 65 has a first electrode portion 65a and a second electrode portion 65b, these portions having different electrode finger widths W and finger-to-finger gaps G. The first electrode portion 65a has electrode fingers 67, and the second electrode portions 65b has electrode fingers 69. The electrode fingers 67 are wider than the electrode fingers 69. The first electrode portion 65a has a comparatively wide electrode finger width and a comparatively wide gap, while the second electrode portion 65b has a comparatively narrow electrode finger width and a comparatively narrow gap.

The cutting-off positions are, for example, the first electrode portions 64a and 65a. As has been described previously, the first electrode portions 64a and 65a have a comparatively wide finger width and a comparatively wide gap, and thus make a comparatively small capacitance. It is therefore possible to obtain a small capacitance change by cutting the comb-like electrodes 64 and 65 along the interface portions 36 and 37 between the first electrode portions 64a and 65a and the second electrode portions 64b and 65b or along arbitrary positions on the first electrode portions 64a and 65a. The first electrode portions 64a and 65a enable finer stepwise capacitance adjustment.

The interdigital capacitor shown in FIG. 8B has an electrode arrangement that enables finer stepwise capacitance adjustment. The interdigital capacitor has comb-like electrodes 70 and 71. The comb-like electrode 70 has a first electrode portion 70a and a second electrode portion 70b. The first electrode portion 70a has electrode fingers 72, and the second electrode portion 70b has electrode fingers 74. The electrode fingers 72 are shorter than the electrode fingers 74. The shorter the electrode fingers, the smaller the capacitance. Thus, a fine stepwise capacitance change can be obtained by cutting the comb-like electrodes 70 and 71 along the interface portions 36 and 37 or along arbitrary portions on the first electrode portions 70a and 71a. When both the first electrode portions 70a and 71a and the second electrode portions 70b and 71b are subject to cutting, two different adjustment steps may be obtained.

Additional first electrode portions that are the same as the first electrode portions 70a and 71a may be provided on the other side of the interdigital capacitance. Thus, a wider adjustment range is available. It is also possible to employ three or more different pairs of comb-like electrodes.

(Sixth Embodiment)

Figure 9:
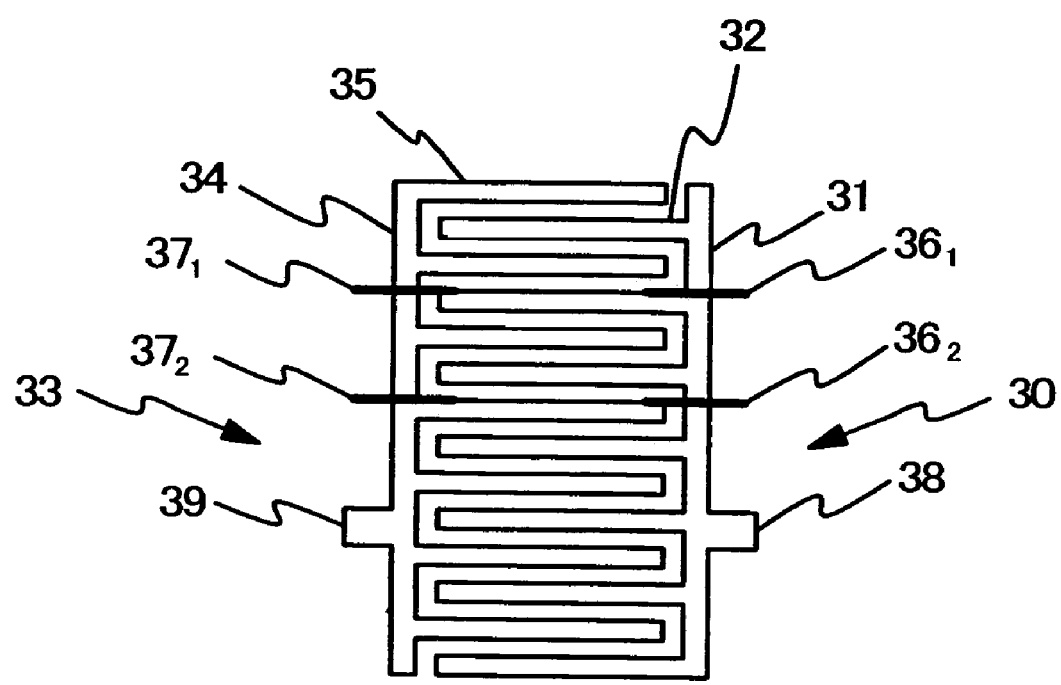
FIG. 9 is a plan view of an interdigital capacitor according to a sixth embodiment of the present invention.

FIG. 9 is a plan view of an interdigital capacitor according to a sixth embodiment of the present invention. In FIG. 9, parts that are the same as those shown in FIGS. 4A and 4B are given the same reference numerals. The sixth embodiment of the invention defines the order of cutting. The cutting position is changed to progressively shift closer to the signal lines 38 and 39 each time cutting is performed until a desired capacitance value is obtained. In FIG. 9, the first cutting is done in cutting positions $36_1$ and $37_1$, and the second cutting is done in cutting positions $36_2$ and $37_2$ closer to the signal lines 38 and 39. It is therefore possible to securely obtain a desired capacitance value.

(Seventh Embodiment)

Figure 10A:
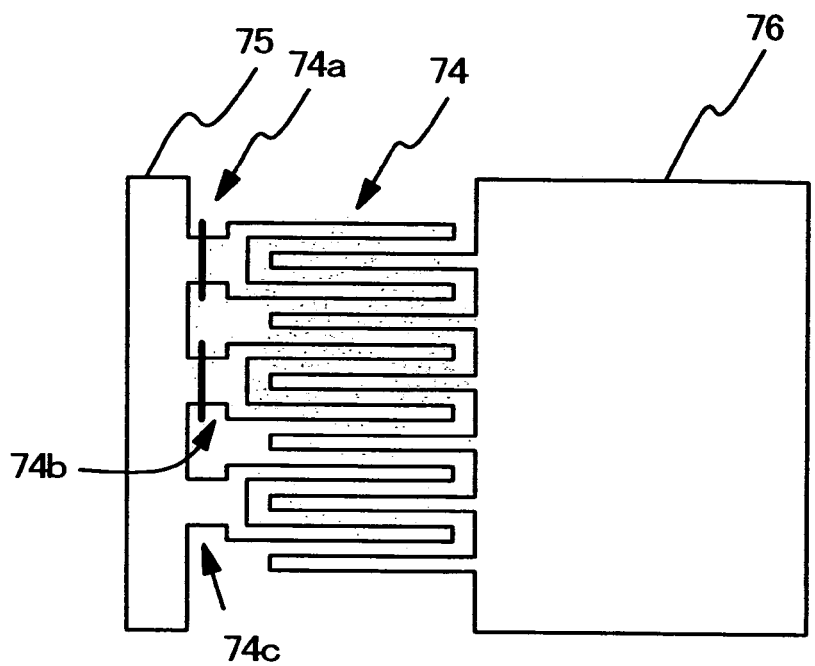
FIG. 10A is a plan view of an interdigital capacitor according to a seventh embodiment of the present invention.
Figure 10B:
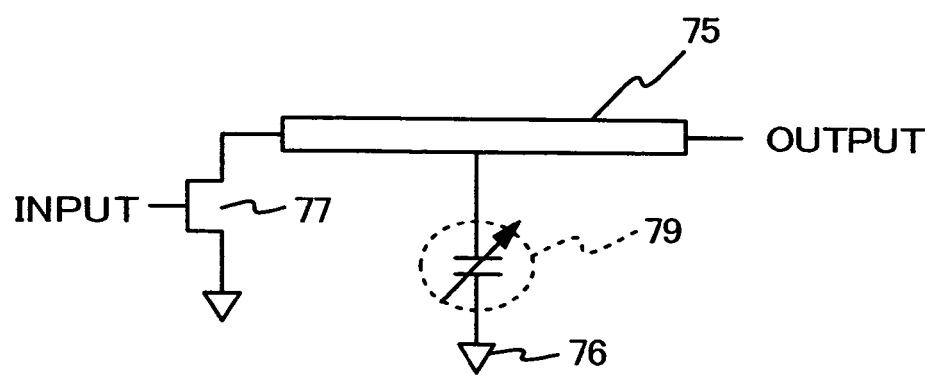
FIG. 10B is a circuit diagram of an oscillator equipped with the interdigital capacitor shown in FIG. 10A.

FIG. 10A is a plan view of an interdigital capacitor according to a seventh embodiment of the present invention, and FIG. 10B is a circuit diagram of an application of the interdigital capacitor shown in FIG. 10A.

Referring to FIG. 10B, a field effect transistor (FET) 77 has a drain to which a signal line 75 is connected. A shunt capacitor 79 is connected to the signal line 75 in order to finely adjust the output matching of the FET 77. The shunt capacitor 79 is formed by the interdigital capacitor of the present invention. As shown in FIG. 10A, the interdigital capacitor (indicated by the same reference number 79) that forms the shunt capacitor 79 has two comb-like electrodes, one of which is connected to ground 76, and the other is connected to the signal line 75 in such a way that two electrode fingers are joined and connected to the signal line 75. Joint portions 74a, 74b and 74c for joining two electrode fingers also serve as cutting target portions. FIG. 10A shows that the joint portions 74a and 74b are cut and the associated electrode fingers are cut off. One of the pair of comb-like electrodes is connected to the ground pattern 76, only the other comb-like electrode is subject to cutting the joint portion(s) for capacitance adjustment.

(Eighth Embodiment)

Figure 11:
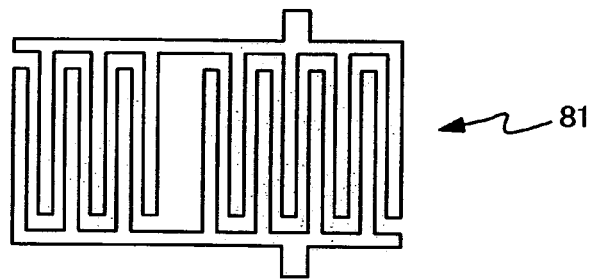
FIGS. 11A through 11F illustrate an interdigital capacitor according to an eighth embodiment of the present invention.
Figure 11:
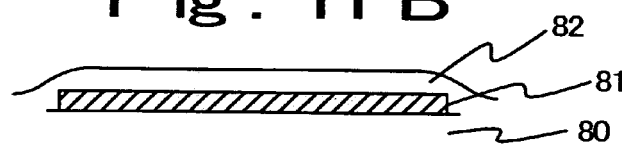
Figure 11:
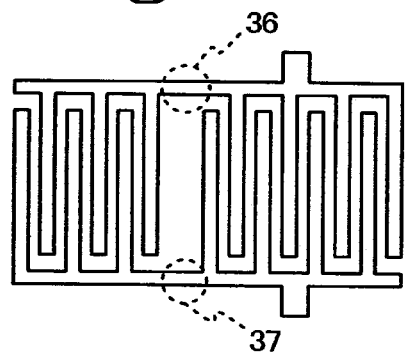
Figure 11:
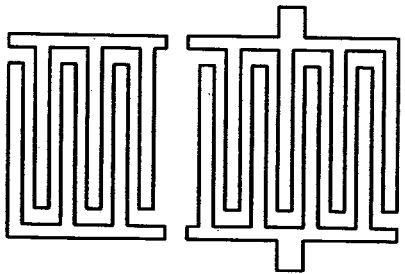
Figure 11:
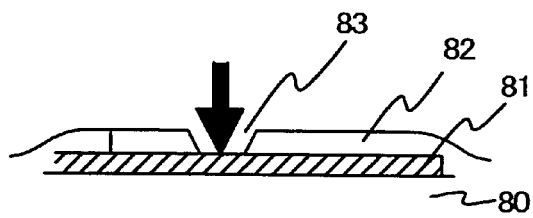
Figure 11:
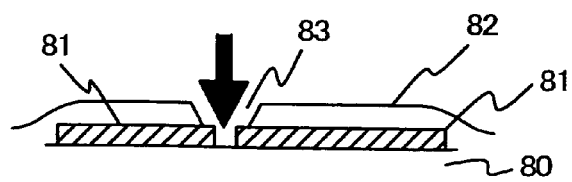

FIGS. 11A through 11F illustrate an eighth embodiment of the present invention. More particularly, FIG. 11A is a plan view of an interdigital capacitor according to the eighth embodiment of the present invention, and FIG. 11B is a cross-sectional view of the interdigital capacitor shown in FIG. 11A. A pair 81 of comb-like electrodes is formed on a semiconductor substrate 80 of silicon, semi-insulating GaAs or the like. An insulating film 82, which serves as an interlayer insulating or protection film, is formed on the surface of the semiconductor substrate 80. The pair 81 of comb-like electrodes is made of, for example, aluminum, gold or copper. The insulating film 82 is made of, for example, polyimide or silicon oxide ($SiO_2$). The materials mentioned above are used in the other embodiments of the present invention.

For example, when the insulating film 82 is made of polyimide, the capacitance may be adjusted as follows. As shown in FIGS. 11C and 11D, a laser beam (illustrated with a solid arrow) having a wavelength of 355 nm is projected onto cutting positions 36 and 37. This results in two windows 83 in the insulating film 82, and the bus lines in the cutting positions 36 and 37 are exposed via the windows 83. Next, as shown in FIGS. 11E and 11F, a laser beam having a wavelength of 532 nm is projected onto the exposed portions of the bus lines, which are thus cut. The wavelength of laser suitable for the material to be trimmed is selected. The projection energy of laser is adjusted based on the thickness of the material to be trimmed. The above adjustment can be carried out by using a microscope and a multi-wave laser system that are available in the market. Trimming may be repeated by monitoring the characteristics of an IC, such as the frequency of an oscillator or the output power of an amplifier until desired characteristics can be obtained.

The windows 83 in the insulating film 82 may be formed by an appropriate means other than laser projection. For example, the windows 83 may be formed by etching with a mask used in the wafer process.

Figure 12A:
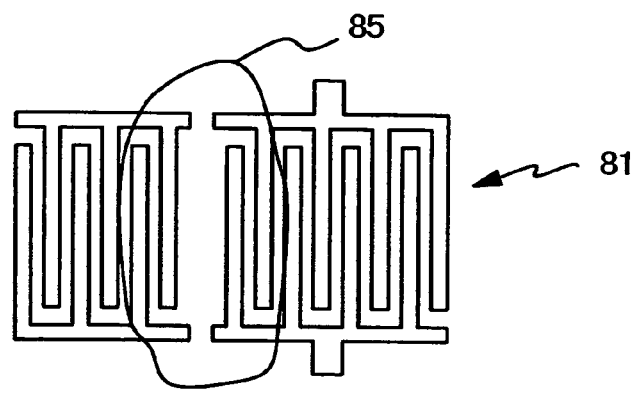
FIG. 12A is a plan view of the interdigital capacitor according to the eight embodiment of the present invention.
Figure 12B:
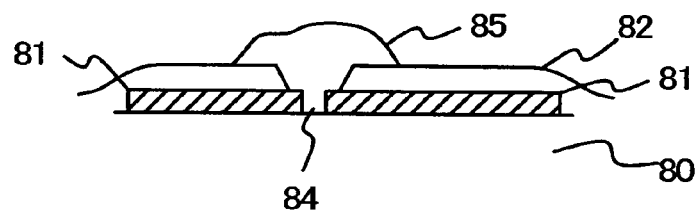
FIG. 12B is a cross-sectional view of the interdigital capacitor shown in FIG. 12A.

As shown in FIGS. 12A and 12B, a protection film 85 may be locally provided so as to cover spaces 84 via which the bus lines are separated into two parts. The protection film 85 protects the pair 81 of comb-like electrodes. The protection film 85 may be of polyimide or silicon oxide.

(Ninth Embodiment)

Figure 13:
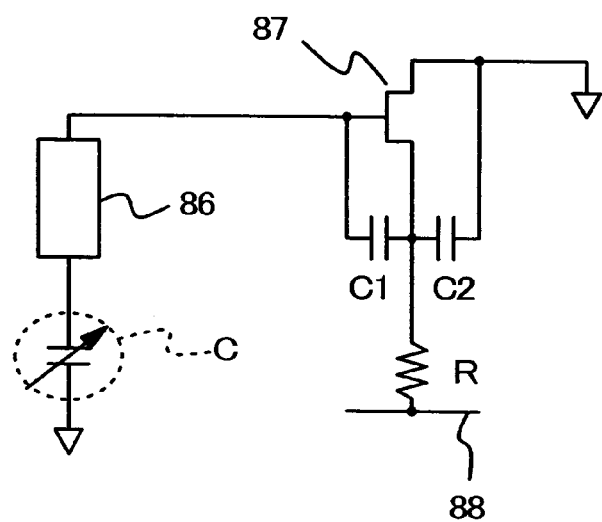
FIG. 13 is a circuit diagram of a millimeter wave oscillator according to a ninth embodiment of the present invention.

FIG. 13 is a circuit diagram of a millimeter wave oscillator circuit. This oscillator circuit includes a resonance circuit having a variable capacitor C and a strip line 86, a transistor 87, two capacitors C1 and C2, and a resistor R connected to a power supply line 88. The above components may be formed on the same semiconductor substrate. The capacitors C1 and C2 make capacitance division, and collaborate with the transistor 87 so that a negative resistance at desired frequencies can be exhibited. The variable capacitor C is formed by the interdigital capacitor of the present invention. The resonance frequency can be adjusted by changing the capacitance of the variable capacitor C.

(Tenth Embodiment)

Figure 14A:
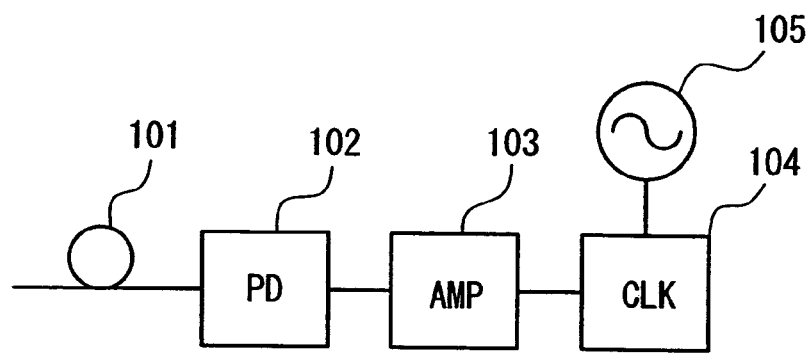
FIGS. 14A and 14B are block diagrams of communication devices according to a tenth embodiment of the present invention.
Figure 14B:
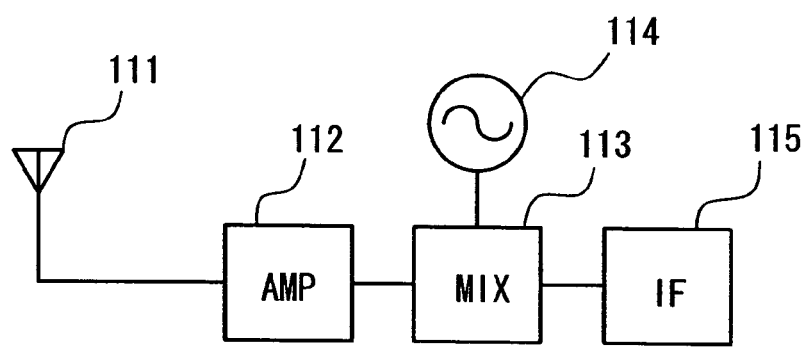

FIGS. 14A and 14B are diagrams of communication devices according to a tenth embodiment of the present invention. More particularly, FIG. 14A shows an optical communication device having a transmission bit rate of 10 Gbps or more, and FIG. 14B shows a millimeter wave radio transmitter.

The optical communication device shown in FIG. 14A includes a photodiode (PD) 102 connected to an optical fiber 101, a preamplifier (AMP) 103, a clock extraction IC (CLK) 104, and an oscillator 105. This oscillator 105 employs the interdigital capacitor of the present invention, and has a circuit configuration as shown in FIG. 13. An optical signal received from the optical fiber 101 is converted into an electric signal by the photodiode 102. The electric signal is amplified by the preamplifier 103. The clock extraction IC 104 is synchronized with an oscillation frequency of the oscillator 105, and extracts a clock from the output of the preamplifier 103.

Referring to FIG. 14B, an intermediate frequency signal supplied from an internal circuit not shown is processed by an IF signal processing circuit (IF) 115. The output signal of the circuit 115 is sent to an up-convert mixer (MIX) 113, which mixes the IF signal with an oscillation signal output by an oscillator 114, which has a circuit configuration as shown in FIG. 13 and employs the interdigital capacitor of the present invention. The up-converted signal is amplified by a transmission amplifier (AMP) 112, and is then transmitted via an antenna 111.

The first through tenth embodiments of the present invention may be combined arbitrarily. Although the present invention achieves fine capacitance adjustment in the millimeter wave band over 30 GHz, the present invention can be used in a microwave band lower than 30 GHz and another frequency band.

The semiconductor devices that have been subject to capacitance adjustment include the comb-like electrodes and an electrode portion that has been cut out of the original comb-like electrodes and is isolated from internal circuits. If there is no need for trimming, the semiconductor devices have the original comb-like electrodes as they are.

The present invention is not limited to the specifically disclosed embodiments, and other embodiments, variations and modifications may be made without departing from the scope of the present invention.

The present invention is based on Japanese patent application no. 2002-093377 filed on Mar. 28, 2002, the entire disclosure of which is hereby incorporated by reference.

What is claimed is:

1. A method for adjusting an interdigital capacitor comprising a pair of comb-like electrodes formed on a semiconductor substrate, and an insulating film that covers the pair of comb-like electrodes and a surface of the semiconductor substrate, the method comprising the steps of:
    (a) projecting a laser beam onto the insulating film so as to form windows in the insulating film; and
    (b) cutting bus lines of the pair of comb-like electrodes exposed via the windows so that each of the pair of comb-like electrodes is divided into two parts.

2. The method according to claim 1, further comprising a step of covering a protection film that covers the windows.

3. The method according to claim 1, wherein the steps (a) and (b) are repeatedly performed until the interdigital capacitance has a desired capacitance.

4. The method according to claim 1, wherein the steps (a) and (b) are initiated in an initial cutting position and are repeatedly carried out while a cutting position is changed to progressively shift closer to signal lines connected to the pair of comb-like electrodes than the initial cutting portion each time the steps (a) and (b) are carried out.

5. A method for adjusting an interdigital capacitor comprising a pair of comb-like electrodes formed on a semiconductor substrate, and an insulating film that covers the pair of comb-like electrodes and a surface of the semiconductor substrate, the method comprising the steps of:
- (a) projecting a first laser beam having a first wavelength onto the insulating film so as to form windows in the insulating film; and
- (b) projecting a second laser beam having a second wavelength onto portions of the comb-like electrodes exposed via the windows so as to divide each of the pair of comb-like electrodes into two parts, the first wavelength being different from the second wavelength.

6. The method according to claim 5, further comprising a step of covering a protection film that covers the windows.

7. The method according to claim 5, wherein the steps (a) and (b) are repeatedly performed until the interdigital capacitance has a desired capacitance.

8. The method according to claim 5, wherein the steps (a) and (b) are initiated in an initial cutting position and are repeatedly carried out while a cutting position is changed to progressively shift closer to signal lines connected to the pair of comb-like electrodes than the initial cutting portion each time the steps (a) and (b) are carried out.

* * * * *